(12) United States Patent
Nakashima et al.

(10) Patent No.: US 8,885,140 B2
(45) Date of Patent: Nov. 11, 2014

(54) SUBSTRATE TREATMENT APPARATUS, SUBSTRATE TREATMENT METHOD AND NON-TRANSITORY STORAGE MEDIUM

(75) Inventors: Tomohiro Nakashima, Koshi (JP); Shin Inoue, Dresden (DE); Yoshitaka Hara, Koshi (JP); Izumi Hasegawa, Koshi (JP); Kunie Ogata, Koshi (JP); Takuya Mori, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 258 days.

(21) Appl. No.: 13/598,924

(22) Filed: Aug. 30, 2012

(65) Prior Publication Data

US 2013/0057836 A1 Mar. 7, 2013

(30) Foreign Application Priority Data

Sep. 2, 2011 (JP) ................................. 2011-191684

(51) Int. Cl.
*G03B 27/32* (2006.01)
*H01L 21/67* (2006.01)

(52) U.S. Cl.
CPC ............................ *H01L 21/67288* (2013.01)
USPC ........................................................ 355/27

(58) Field of Classification Search
CPC .... G03F 1/82; G03F 7/3021; H01L 21/67288
USPC .......... 355/27; 118/50, 64; 438/660; 396/611
See application file for complete search history.

(56) References Cited

U.S. PATENT DOCUMENTS 6,435,199 B1 *  8/2002 Kamikawa ...................... 134/76

FOREIGN PATENT DOCUMENTS

JP    A-2008-072016    3/2008

* cited by examiner

*Primary Examiner* — Hung Henry Nguyen
(74) *Attorney, Agent, or Firm* — Posz Law Group, PLC

(57) ABSTRACT

The present invention is a substrate treatment apparatus for performing solution treatment on a substrate, performing post-treatment in a treatment module subsequent to the solution treatment, including: a solution treatment section including a plurality of nozzles prepared for respective kinds of treatment solutions corresponding to lots of substrates; a transfer mechanism for transferring the substrate; a monitoring section monitoring whether there is a failure in discharge of the treatment solution in the nozzle; and a control unit outputting a control signal to prohibit the solution treatment in the solution treatment section for a substrate scheduled to be treated using a nozzle determined to have a failure by the monitoring section and to perform the solution treatment in the solution treatment section for a substrate scheduled to be treated using a nozzle other than the nozzle determined to have a failure.

13 Claims, 16 Drawing Sheets

FIG.8

| WAFER | INSPECTION RESULT | COT 1 | COT 2 | COT 3 | HP 1 | HP 2 | CPL |
|---|---|---|---|---|---|---|---|
| W1 | PASS | PASS | | | | | PASS |
| W2 | PASS | | PASS | | PASS | PASS | PASS |
| W3 | PASS | | | PASS | PASS | | PASS |
| W4 | PASS | PASS | | | | PASS | PASS |
| W5 | FAIL | | FAIL | | FAIL | | PASS |
| W6 | PASS | | | PASS | | PASS | PASS |
| W7 | FAIL | FAIL | | | FAIL | | PASS |
| W8 | PASS | | PASS | | | PASS | PASS |
| W9 | PASS | | | PASS | PASS | | PASS |
| W10 | PASS | PASS | | | | PASS | PASS |
| W11 | PASS | | PASS | | PASS | | PASS |
| ... | ... | ... | ... | ... | ... | ... | ... |

FIG. 10

| WAFER | INSPECTION RESULT | COT 1 | COT 2 | COT 3 | HP 1 | HP 2 | CPL |
|---|---|---|---|---|---|---|---|
| W1 | PASS | PASS | | | | | PASS |
| W2 | PASS | | PASS | | PASS | | PASS |
| W3 | PASS | | | PASS | | PASS | PASS |
| W4 | FAIL | FAIL | | | FAIL | | PASS |
| W5 | FAIL | | FAIL | | | FAIL | PASS |
| W6 | FAIL | | | FAIL | FAIL | | PASS |
| W1 | PASS | PASS | | | | | PASS |
| W2 | PASS | | PASS | | PASS | | PASS |
| W3 | PASS | | | PASS | | PASS | PASS |
| W4 | PASS | PASS | | | PASS | | PASS |
| W5 | PASS | | PASS | | | | PASS |

WAFERS Wa IN ONE LOT (TREATMENT SOLUTION NOZZLE 25a)

WAFERS Wb IN NEXT LOT (TREATMENT SOLUTION NOZZLE 25b)

FIG.11

| WAFER | INSPECTION RESULT | COT 1 | COT 2 | COT 3 | HP 1 | HP 2 | CPL |
|---|---|---|---|---|---|---|---|
| W1 | FAIL | FAIL | | | | | |
| W2 | PASS | | PASS | | FAIL | | PASS |
| W3 | PASS | | | PASS | PASS | PASS | PASS |
| W4 | FAIL | FAIL | | | | FAIL | PASS |
| W5 | PASS | | PASS | | PASS | | PASS |
| W6 | PASS | | | PASS | | PASS | PASS |
| W7 | FAIL | FAIL | | | FAIL | | PASS |
| W8 | PASS | (STOP USE) | PASS | | PASS | | PASS |
| W9 | PASS | → | | PASS | | PASS | PASS |
| W10 | PASS | | PASS | | PASS | | PASS |
| W11 | PASS | | | PASS | PASS | | PASS |

FIG.12

| WAFER | INSPECTION RESULT | COT 1 | COT 2 | COT 3 | HP 1 | HP 2 | CPL |
|---|---|---|---|---|---|---|---|
| W1 | PASS | PASS | | | PASS | | PASS |
| W2 | PASS | | PASS | | | PASS | PASS |
| W3 | FAIL | | | FAIL | | | PASS |
| W4 | PASS | PASS | | | FAIL | PASS | PASS |
| W5 | FAIL | | FAIL | | | | PASS |
| W6 | PASS | | | PASS | FAIL | | PASS |
| W7 | FAIL | FAIL | | | | PASS | PASS |
| W8 | PASS | PASS | | | (STOP USE) | PASS | PASS |
| W9 | PASS | | PASS | | → | PASS | PASS |
| W10 | PASS | | | PASS | | PASS | PASS |
| W11 | PASS | PASS | | | | PASS | PASS |
| --- | --- | --- | --- | --- | --- | --- | --- |

SUBSTRATE TREATMENT APPARATUS, SUBSTRATE TREATMENT METHOD AND NON-TRANSITORY STORAGE MEDIUM

BACKGROUND OF THE INVENTION

1. Field of the Invention

The present invention relates to a technical field of supplying a treatment solution from a nozzle to the front surface of a substrate to perform solution treatment.

2. Description of the Related Art

In the photolithography process in a semiconductor manufacture, a coating and developing apparatus is used which performs a series of treatments for coating and developing the resist. In the resist coating unit arranged in this apparatus, a plurality of treatment solution nozzles assigned to the respective kinds of resist solutions being treatment solutions are provided, and a nozzle discharging the treatment solution according to the kind of the substrate is selected and used. Further, there is a known structure in which a plurality of solution treatment modules in each of which a spin chuck is disposed inside a cup are arranged side by side in the horizontal direction and a plurality of treatment solution nozzles are gathered to be shared between the plurality of solution treatment modules.

There also is a known coating and developing apparatus including an inspection unit performing inspection of the substrate, in which case after a resist film is formed, inspection is performed on the substrate before exposure, and when it is defective, the operation of the resist coating unit which has performed the treatment on the substrate is stopped and maintenance thereof is performed. When a plurality of resist coating units are arranged, other resist coating units other than the coating unit under maintenance are used, but the treatment efficiency decreases by one resist coating unit. Further, substrates located upstream of the resist coating unit are sometimes collected without being subjected to subsequent treatments depending on their positions, and substrates which have been subjected to rework treatment, for example, on which an anti-reflection film has been already formed are subjected to removal treatment of the anti-reflection film using a treatment solution.

A technique of achieving a high throughput is described about a solution treatment apparatus in which a plurality of solution treatment modules are provided and nozzle parts discharging treatment solutions to the respective modules are shared in Japanese Laid-open Patent Publication No. 2008-72016, but is different from the present invention.

SUMMARY OF THE INVENTION

The present invention has been made under such circumstances and its object is to provide a technique capable of suppressing a decrease in treatment efficiency against a trouble occurring in a solution treatment section in a solution treatment apparatus including the solution treatment section including a plurality of nozzles prepared for respective kinds of treatment solutions corresponding to lots of substrates.

A substrate treatment apparatus of the present invention is a substrate treatment apparatus for performing, in a treatment block, solution treatment on a substrate taken out of a carrier being a substrate transfer container, performing post-treatment in a treatment module subsequent to the solution treatment, and delivering the substrate which has been subjected to a series of treatments including the solution treatment and the post-treatment to the carrier, the apparatus including:

a solution treatment section provided in the treatment block and including a solution treatment module configured such that a cup body surrounds a periphery of a substrate holding part horizontally holding the substrate, and a plurality of nozzles prepared for respective kinds of treatment solutions corresponding to lots of substrates;

a transfer mechanism for transferring the substrate in the treatment block;

a monitoring section monitoring whether there is a failure in discharge of the treatment solution in the nozzle; and a control unit outputting a control signal to prohibit the solution treatment in the solution treatment section for a substrate scheduled to be treated using a nozzle determined to have a failure by the monitoring section and to perform the solution treatment in the solution treatment section for a substrate scheduled to be treated using a nozzle other than the nozzle determined to have a failure.

A substrate treatment method of the present invention according to another aspect is a substrate treatment method of performing, in a treatment block, solution treatment on a substrate taken out of a carrier being a substrate transfer container, performing post-treatment in a treatment module subsequent to the solution treatment, and delivering the substrate which has been subjected to a series of treatments including the solution treatment and the post-treatment to the carrier, the method including the steps of:

through use of a solution treatment section provided in the treatment block and including a solution treatment module configured such that a cup body surrounds a periphery of a substrate holding part horizontally holding the substrate, and a plurality of nozzles prepared for respective kinds of treatment solutions corresponding to lots of substrates, transferring the substrate by a transfer mechanism into the solution treatment module;

discharging a treatment solution to the substrate from the nozzle discharging the treatment solution of the kind corresponding to the substrate to perform the solution treatment;

monitoring whether there is a failure in discharge of the treatment solution in the nozzle; and controlling the transfer mechanism such that the solution treatment in the solution treatment section is prohibited for a substrate scheduled to be treated using a nozzle determined to have a failure by the monitoring step and the solution treatment in the solution treatment section is performed for a substrate scheduled to be treated using a nozzle other than the nozzle determined to have a failure.

A storage medium of the present invention according to still another aspect is a non-transitory storage medium storing a computer program used in a substrate treatment apparatus for performing, in a treatment block, solution treatment on a substrate taken out of a carrier being a substrate transfer container, performing post-treatment in a treatment module subsequent to the solution treatment, and delivering the substrate which has been subjected to a series of treatments including the solution treatment and the post-treatment to the carrier, wherein the computer program is for executing the substrate treatment method.

According to the present invention, the solution treatment can be performed on substrates scheduled to be treated using another nozzle without failure in the solution treatment section as it is, thereby suppressing a decrease in treatment efficiency for subsequent substrates.

BRIEF DESCRIPTION OF THE DRAWINGS

FIG. 8 is a chart illustrating an example of substrate treatment results and a substrate transfer schedule in normal operation in the embodiment;

FIG. 10 is a chart illustrating an example of substrate treatment results and a substrate transfer schedule when use of a part of treatment solution nozzles provided in the resist supply part is stopped in the embodiment;

FIG. 11 is a chart illustrating an example of substrate treatment results and a substrate transfer schedule when use of a part of coating modules provided in the coating unit is stopped in the embodiment;

FIG. 12 is a chart illustrating an example of substrate treatment results and a substrate transfer schedule when use of a part of heating modules provided in the coating and developing apparatus is stopped in the embodiment;

DETAILED DESCRIPTION OF THE INVENTION

Figure 1:
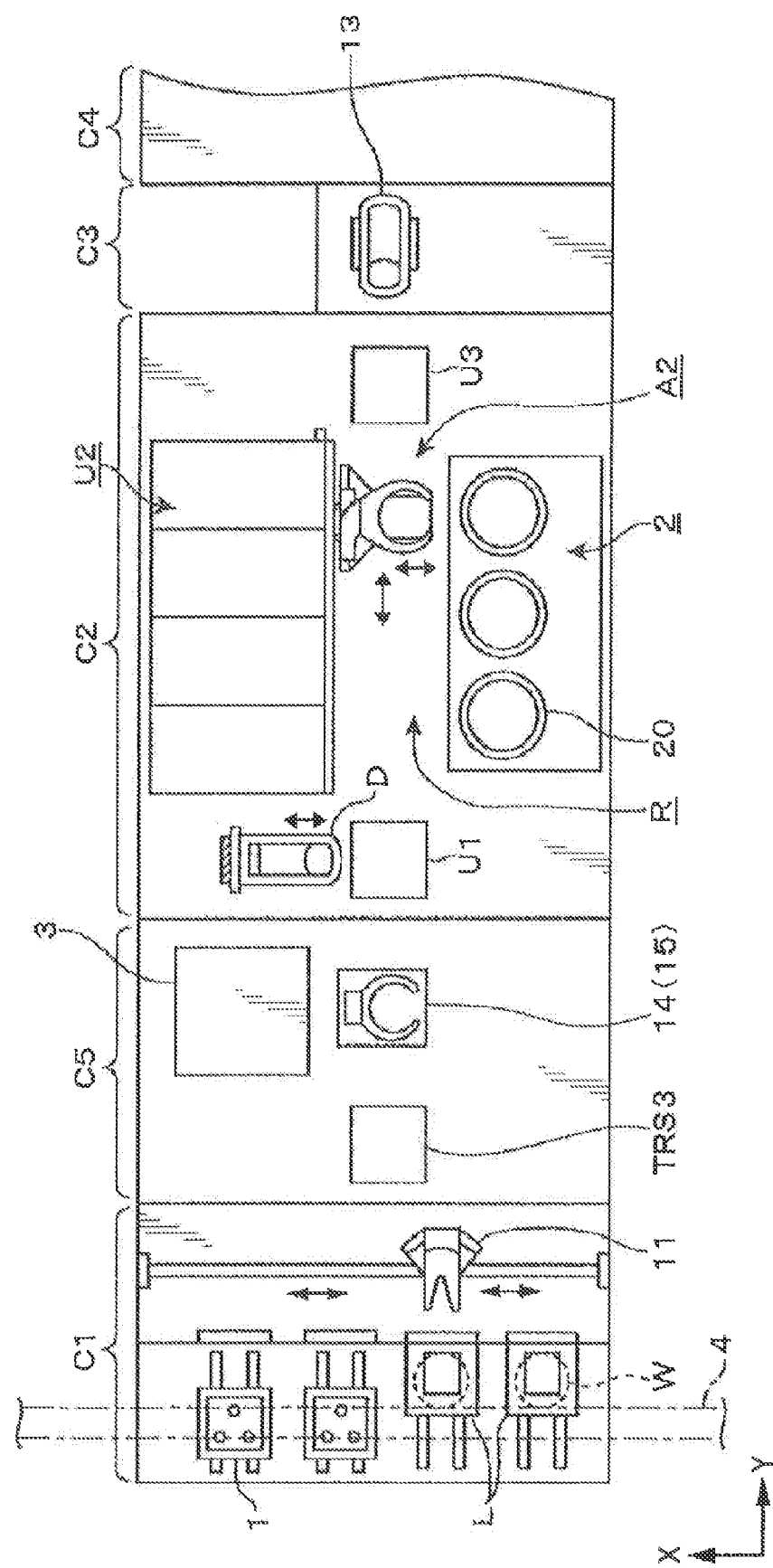
FIG. 1 is a plan view illustrating a coating and developing apparatus according to an embodiment of the present invention.
Figure 2:
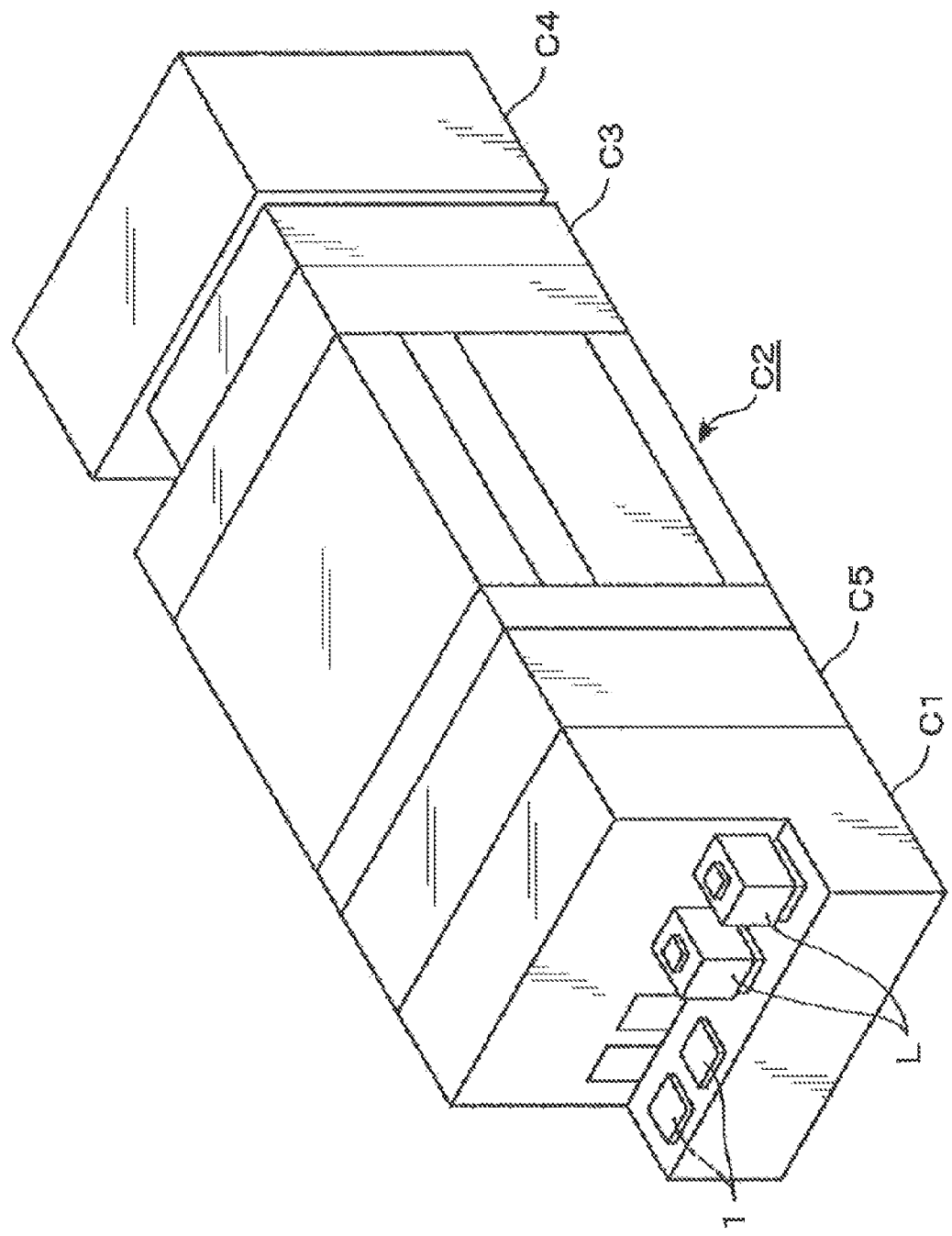
FIG. 2 is a perspective view of the coating and developing apparatus in FIG. 1.

Hereinafter, an embodiment in which a substrate treatment apparatus of the present invention is applied to a coating and developing apparatus will be described. The whole configuration of the coating and developing apparatus will be briefly described first referring to the drawings. FIG. 1 illustrates a plan view of one embodiment of the coating and developing apparatus, and FIG. 2 is a schematic perspective view of the same. This apparatus includes a carrier block C1, a treatment block C2, an interface block C3, and an inspection block C5. In the carrier block C1, a wafer W is taken out by a delivery arm 11 from a closed-type carrier L mounted on a mounting table 1 and delivered to the treatment block C2 via the inspection block C5 adjacent to the block C1. The wafer W which has been subjected to coating treatment in the treatment block C2 is once inspected in the inspection block C5, then passes through the treatment block C2, and is sent to an exposure block C4 via the interface block C3. The wafer W after exposure is subjected to developing treatment in the treatment block C2, and then returned to the carrier L.

The treatment block C2 is constituted of, in this example, a first block (DENT floor) B1 for performing developing treatment, a second block (BCT floor) B2 for forming an anti-reflection film on the lower side of a resist film, and a third block (COT floor) B3 for performing coting treatment of a resist solution, which are stacked in order from the bottom as illustrated in FIG. 2.

These first to third blocks B1 to B3 are substantially similarly configured, and solution treatment units 2, a shelf unit U2 in which modules of a heating and cooling system for performing pre-treatment and post-treatment of the treatment performed in the solution treatment units 2 are arranged at a plurality of tiers, and transfer arms A1 to A3 forming transfer means delivering the wafers between sections in the shelf unit U2 and the solution treatment units 2 are provided.

The transfer arms A1 to A3 are configured to be movable forward and backward, moving up and down, rotatable around the vertical axis and movable in a Y-axis direction in FIG. 1 in a transfer path R, and each has two forks for supporting an edge area on the rear surface side of the wafer W. These forks are configured to be movable forward and backward independent of each other.

The solution treatment units 2 and the shelf unit U2 are arranged to face each other along the transfer path R. Further, in the solution treatment unit 2, solution treatment modules 20 in each of which a spin chuck is provided inside a cup body are arranged side by side along the transfer path R. The solution treatment modules 20 are provided in each of a unit applying a treatment solution for forming an anti-reflection film on the lower side of the resist in the second block B2 and a unit applying the resist solution in the third block B3. Further, the solution treatment units 2 performing developing treatment are provided at two tiers in the first block B1.

Figure 3:
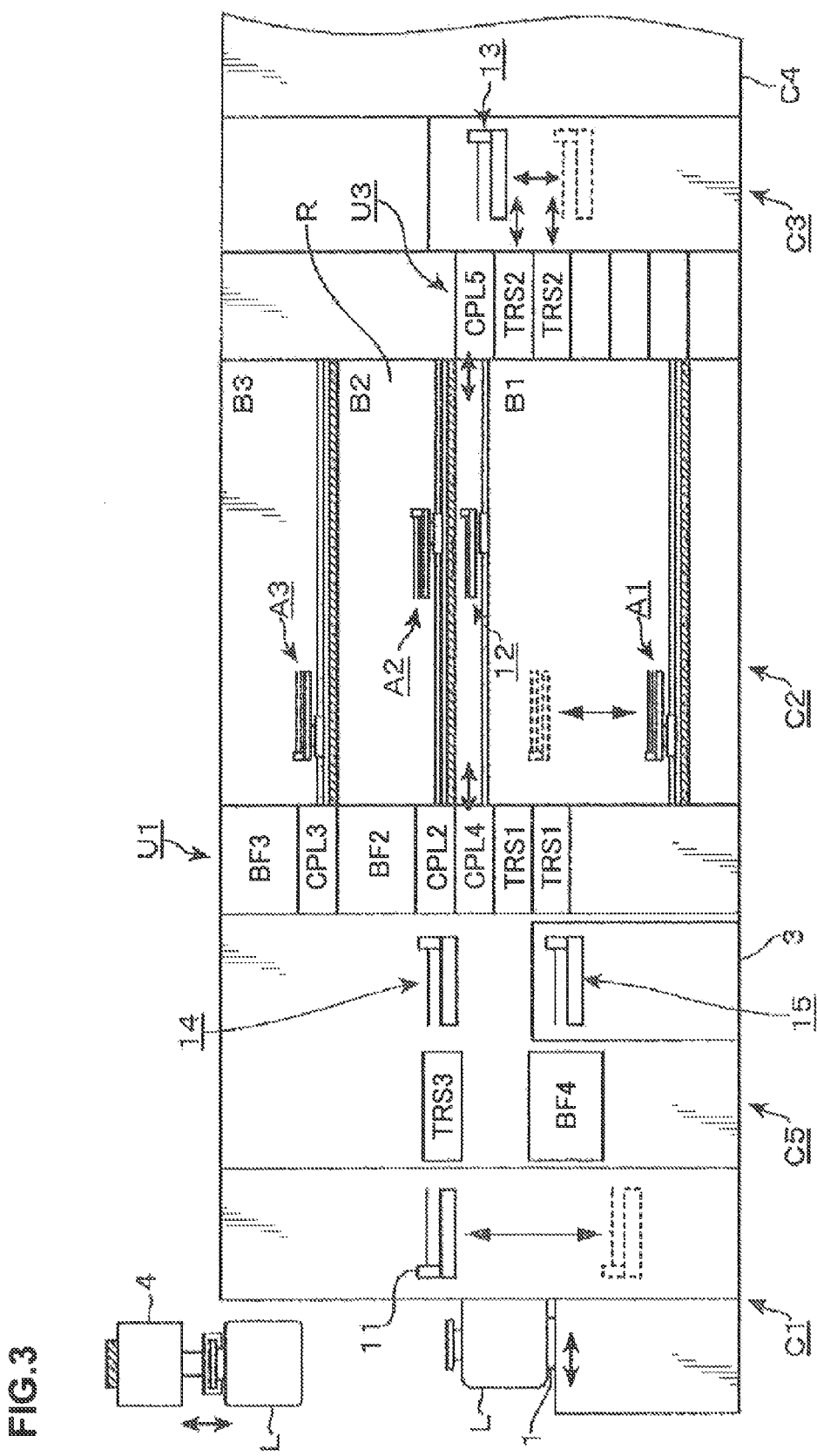
FIG. 3 is a longitudinal side view of the coating and developing apparatus in FIG. 1.

U1 and U3 in FIG. 1 and FIG. 3 are shelf units, and transfer of the wafer W between stages at tiers in the shelf unit U1 is performed by a delivery arm D. The transfer of the wafer W between the stages at tiers in the shelf unit U3 is performed by a delivery arm 13. In FIG. 3, CPL is a cooling stage being a stage for temperature regulation, TRS is a delivery stage, and BF is a buffer stage group. The wafer W on which the anti-reflection film is formed in the BCT floor B2 is sent to the COT floor B3 via one of the buffer stage group BF2 and a cooling stage CPL3, and sent to the inspection module 3 via the shelf unit U1 after a resist film is formed thereon. The wafer W is then sent to the interface block C3 via a shuttle arm 12 (see FIG. 3) and a cooling stage CPL5 in the shelf unit U3. The wafer W after exposure is sent to the inspection module 3 via a delivery stage TRS2, the DEV floor B1, and the delivery stage TRS1, and then returned to the carrier L.

In the inspection block C5, a transfer arm 14 transferring the wafer W, which has been delivered from the carrier block C1 side to a delivery stage TRS3, to the shelf unit U1, and a transfer arm 15 delivering the wafer W between the shelf unit U1, the inspection module 3 and a buffer stage BF4 are provided. The inspection module 3 includes an inspection module (not illustrated) performing measurement of the film thickness of the resist film, detection of unevenness of coating of the resist film and so on, an inspection module (not illustrated) performing inspection of the line width of a pattern after development, and so on.

Above the carrier block C1, a ceiling transfer mechanism (OHT) 4 is provided which transfers the carrier L along the ceiling and transfers the carrier L to/from a transfer-in/out port (not illustrated) of the coating and developing apparatus.

Figure 4:
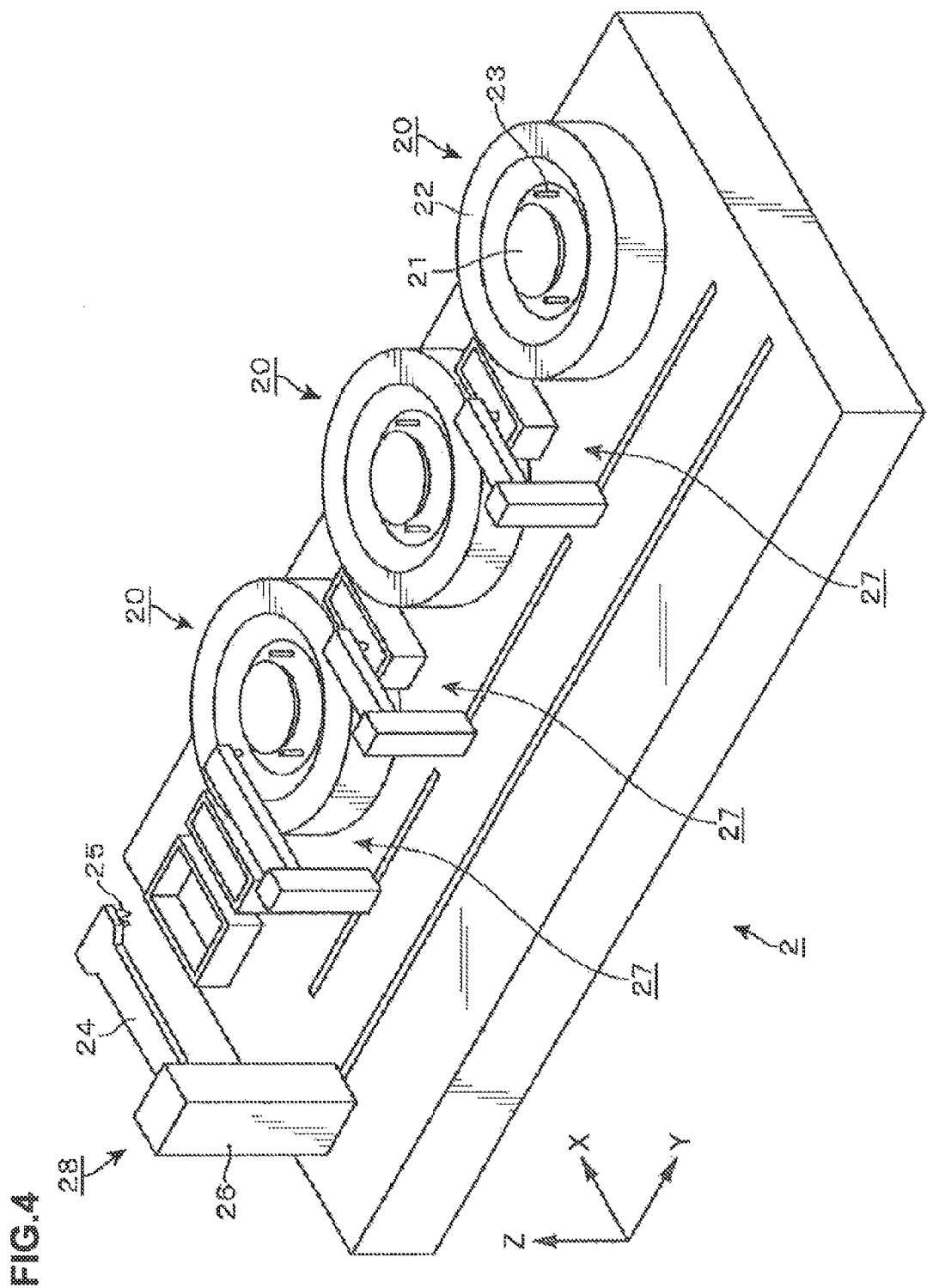
FIG. 4 is a perspective view illustrating a coating unit provided in the coating and developing apparatus in FIG. 1.
Figure 5:
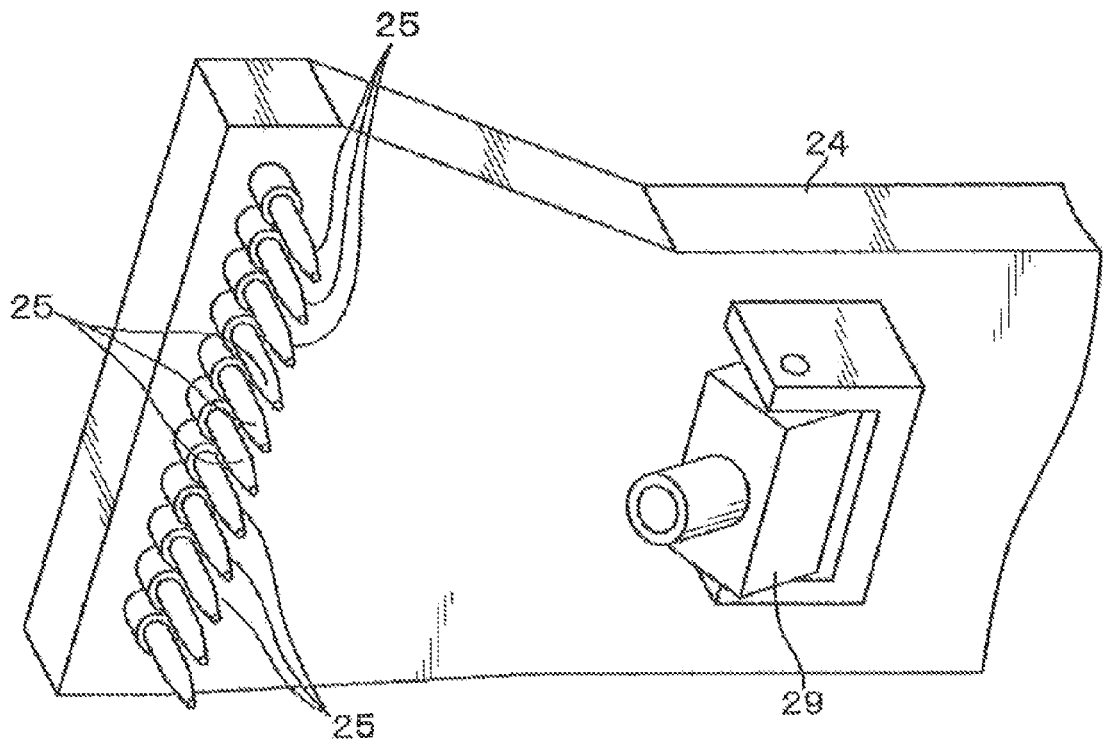
FIG. 5 is a perspective view illustrating a part of a resist supply part provided in the coating and developing apparatus in FIG. 1.

As a representative of the solution treatment units 2, a coating unit 2 being the solution treatment unit in the third block B3 will be described in detail using FIG. 4 and FIG. 5. In the coating unit 2, for example, three coating modules 20 being the solution treatment modules are provided. This coating module 20 mainly has a spin chuck 21 being a substrate holding part holding and rotating the wafer W thereon, a cup body 22 for receiving an excessive of the supplied resist solution, and raising and lowering pins 23 serving to deliver the wafer W between the spin chuck 21 and the transfer arm A3.

In the coating unit 2, a resist supply part 28 is provided. To the resist supply part 28, a plurality of treatment solution nozzles 25 are provided along an arrangement direction of the coating modules 20, on the tip side of one common arm 24 which is supported in a cantilever manner and horizontally extends as illustrated in FIG. 5. These treatment solution nozzles 25 are assigned to respective kinds to treatment solutions, and the treatment solution nozzle 25 corresponding to the lot of the wafers W to be treated is selected in solution treatment. In short, one treatment solution is used for one lot. Further, these treatment solution nozzles 25 are connected to independent treatment solution supply systems respectively. The treatment solution supply system is composed of a treatment solution supply source, a flow rate regulating part, a valve, a micro flowmeter, the treatment solution nozzle 25 and piping connecting them (none of them is illustrated), and a later-described control unit 5 analyzes detection data by the micro flowmeter to detect mixture of air bubbles and abnormality in discharge amount in the treatment solution supply system. Further, an imaging mechanism, for example, a CCD camera 29 is provided at the lower portion on the tip side of the common arm 24. The CCD camera 29 images the vicinity of the treatment solution nozzle 25, and the control unit 5 analyzes its imaging signal, thereby monitoring the abnormality of the treatment solution discharge state such as solution flow reduction or solution shortage and whether dirt adheres to the treatment solution nozzle itself. Further, the resist supply part 28 moves along the arrangement direction of the coating modules 20 by means of a drive mechanism 26 and thereby can supply the treatment solution to each of the coating modules 20. Further, a numeral 27 denotes a coating film edge portion removing mechanism corresponding to each of the coating modules 20.

Figure 6:
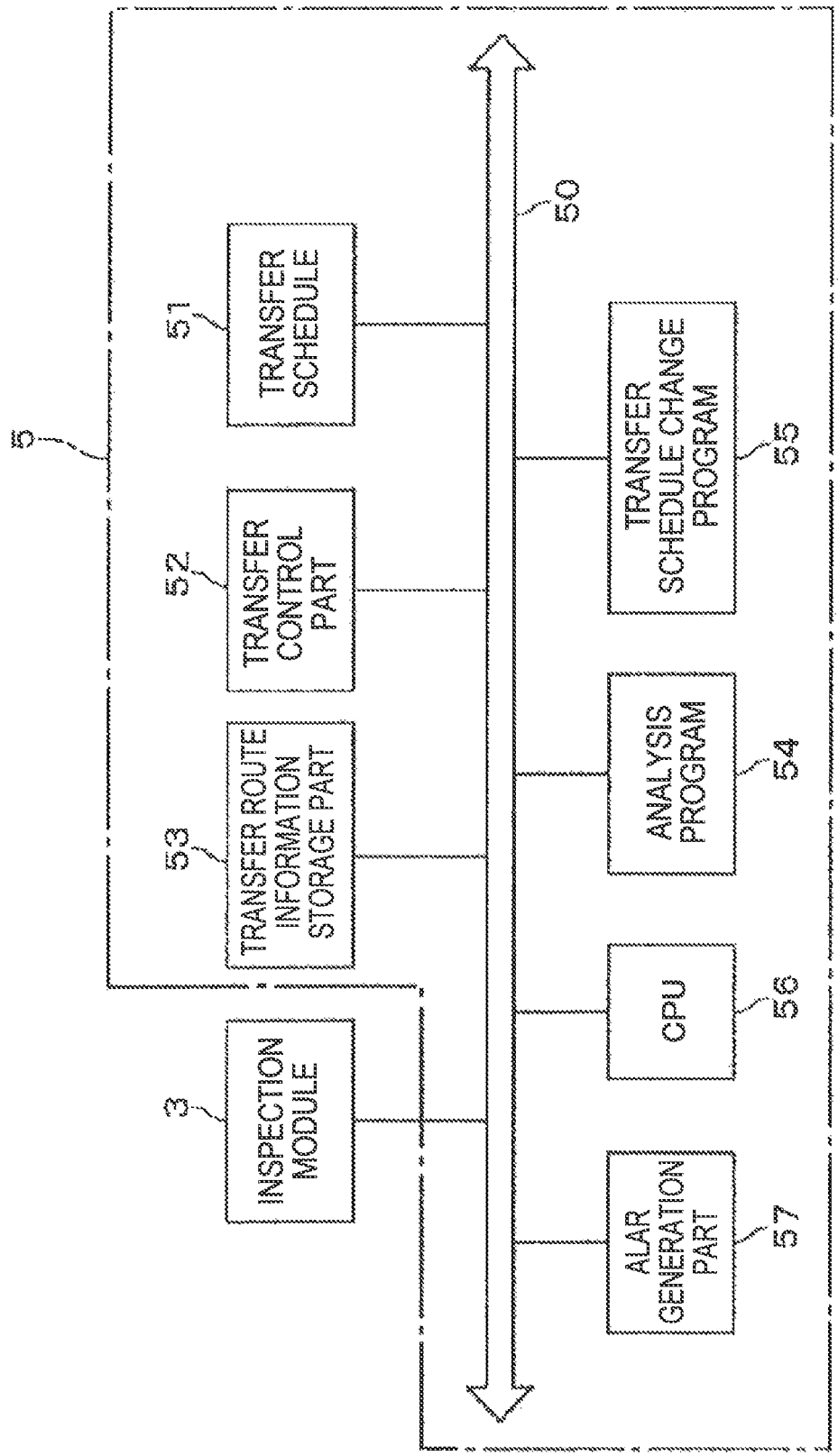
FIG. 6 is a block diagram schematically illustrating a control unit provided in the coating and developing apparatus in FIG. 1.

The coating and developing apparatus includes the control unit composed of a computer. FIG. 6 illustrates the configuration of the control unit 5, which will be described mainly for parts being essential parts of this embodiment with illustration of only a part of components though it is actually composed of a CPU, a program, a memory and so on.

In FIG. 6, a numeral 50 denotes a bus to which a transfer schedule 51, a transfer control part 52, a transfer route information storage part 53, an analysis program 54, a transfer schedule change program 55, a CPU 56, an alarm generation part 57, the inspection module 3 and so on are connected. In the transfer schedule 51, contents such as the timing at which and the module to which a wafer W is transferred are stored for all of the wafers W in a lot. The transfer control part 52 refers to the transfer schedule 51 and controls the delivery arms 11, 13, D, the transfer arms 14, 15, A1 to A3, and the shuttle arm 12 to transfer each wafer W to the module corresponding to the wafer W, thereby executing a transfer cycle.

In the transfer route information storage part 53, information on the transfer route through which the wafer W has passed and on the inspection result is stored at any time. The analysis program 54 is a program for specifying a portion which is a cause of a failure from the information on the inspection result relating to the coating treatment of an individual wafer W detected by the inspection module 3 and the transfer route information stored in the transfer route information storage part 53. The transfer schedule change program 55 is a program for referring to the information on the portion, at which a failure occurs and which becomes unusable, specified by the analysis program 54 and changing the transfer schedule 51 not to use the unusable portion. These programs may be stored in a non-transitory storage medium. Note that these programs may be the one which is stored, for example, in a computer-readable storage medium H such as a computer-readable hard disk (HD), flexible disk (FD), compact disk (CD), magneto-optical disk (MO), or memory card.

The CPU 56 executes operation based on the analysis program 54 and the transfer schedule change program 55. When a defect is detected in the inspection module 3 or an unusable portion occurs, the alarm generation part 57 outputs an alarm to the effect, for example, in the form of lighting of a lamp, generation of an alarm sound, alarm display on a display screen or the like.

The above-described micro flowmeter and CCD camera 29 constitute a part of a monitoring section together with a part of the control unit 5 analyzing the detection data obtained by them. Further, the inspection module 3, the transfer route information storage part 53, and the analysis program 54 are also a part of the monitoring section. In this case, the transfer route information storage part 53 corresponds to the storage part, and the CPU 56 and the analysis program 54 correspond to a determination part.

Figure 7:
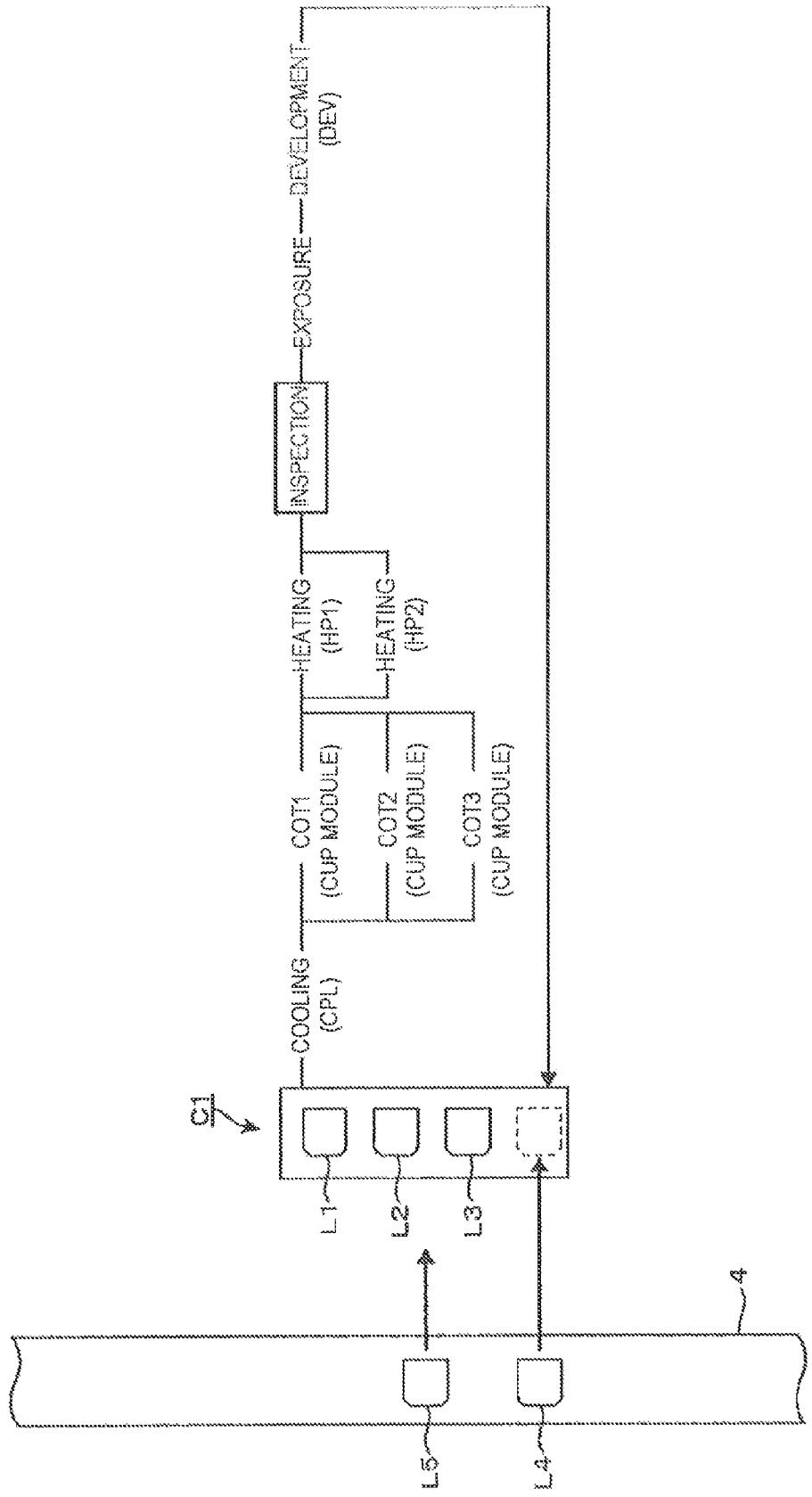
FIG. 7 is a schematic diagram illustrating a substrate treatment flow in the embodiment.

Next, the operation in this embodiment will be described. Since the description will be complicated if a flowchart of the wafer W in the whole coating and developing apparatus, a flowchart of the wafer W in which the flow at a region where the resist film is formed in the coating unit 2 applying the resist is emphatically illustrated in FIG. 7 for easy understanding of this embodiment. As for symbols of the three coating modules 20 each including the cut body 22 and the spin chuck 21, COT1, COT2, COT3 are assigned for convenience.

FIG. 8 is a chart illustrating the treatment modules in which the wafers W in one lot have been treated and inspection results in normal operation, and data corresponding to the chart is the transfer route information. The wafers W are transferred into and subjected to coating treatment in the order of taking-out order (transfer order) from the carrier L, in the three coating modules COT1 to COT3 in this order, and transferred alternately into two heating modules HP1, HP2 and processed therein for heating treatment as illustrated in FIG. 8. Numerals added after the wafers W are turns assigned to the wafers W in the lot. Then, the inspection is performed on all of the wafers W in the inspection module 3, and the inspection result is stored in the transfer route information storage part 53.

As for the transfer route information whose one example is illustrated in FIG. 8, when the inspection result of the wafer W (the inspection result of the resist film in this example) is defective, it is assumed that there is a trouble in the resist coating unit 2 or the heating modules HP, and a sign "FAIL" indicating a defect is written at the determination section corresponding to the resist coating unit 2 and the heating module HP. Meanwhile, as for the failure in the cooling plates CPL, the frequency of trouble is significantly low as compared to that of the resist coating unit 2 and the heating modules HP, and therefore a sign "PASS" indicating normality is written at the determination section corresponding to the cooling plate.

In the example illustrated in FIG. 8, the wafer W5 and the wafer W7 are determined to be defective in the inspection. The wafer W5 and the wafer W7 are defective products and therefore discarded, but the treatment on the other wafers in the same lot is continued as scheduled. As for the determination of continuation of the treatment, the defects in the wafer W5 and the wafer W7 may accidentally occur, and therefore the operation is continued as it is at this stage. Accordingly, the subsequent wafers W are sequentially treated in the modules, and the information on the transfer routes of the wafers W are stored in the transfer route information storage part 53. Associating the treatment so far with the flow in FIG. 9, the wafer W which has been subjected to the coating treatment of the resist film is inspected in the inspection module 3, and the result is written into the transfer route information storage part 53 (Step S1). Then, the presence or absence of occurrence of a defect is confirmed (Step S1a), and when the defect is confirmed, analysis of the situation of the trouble is performed by the analysis program 54 (Step S2). As for handling of the analysis, when it is determined that the trouble is accidental (Step S6), the operation is continued as it is (Step S10).

FIG. 10 is a chart illustrating the treatment modules in which the wafers W have been treated, the presence or absence of a failure therein, and inspection results in a case of trouble of the treatment solution nozzle 25. In this example, the wafers W4 to W6 in sequence are determined to be defective. It is unlikely that failures occur at the same time in the three coating modules COT1 to COT3 or the two heating modules HP1, HP2. Therefore, when the wafers W which have been treated in the different coating modules COT using the same treatment solution nozzle 25 are determined to be defective, for example, three times in a row as in this example, the defects are determined to be caused from the trouble of the treatment solution nozzle 25 (Step S3 in FIG. 9).

FIG. 11 is a chart illustrating the treatment modules in which the wafers W have been treated, the presence or absence of a failure therein, and inspection results in a case of trouble of the coating module COT. In this example, the wafers W1, W4, W7 are determined to be defective. All of the three wafers W1, W4, W7 determined to be defective have been treated in the coating module COT1, and the wafers W which have been treated in the other coating modules COT2, COT3 are determined to be non-defective. It is also unlikely that failures occur at the same time in the two heating modules HP1, HP2. Based on these situations, when the wafers W which have been treated in the same coating module COT are determined to be defective, for example, three times in a row as in this example, the defects are determined to be caused from the trouble of the coating module COT (Step S4 in FIG. 9).

FIG. 12 is a chart illustrating the treatment modules in which the wafers W have been treated, the presence or absence of a failure therein, and inspection results in a case of trouble of the heating module HP. In this example, the wafers W3, W5, W7 are determined to be defective. All of the three wafers W3, W5, W7 determined to be defective have been treated in the heating module HP1, and the wafers W which have been treated in the other heating module HP2 are determined to be non-defective. Further, the wafers W3, W5, W7 determined to be defective have been treated in the different coating modules COT1 to COT3. Based on these situations, when the wafers W which have been treated in the same heating module HP are determined to be defective, for example, three times in a row as in this example, the defects are determined to be caused from the trouble of the heating module HP (Step S5 in FIG. 9).

Figure 9:
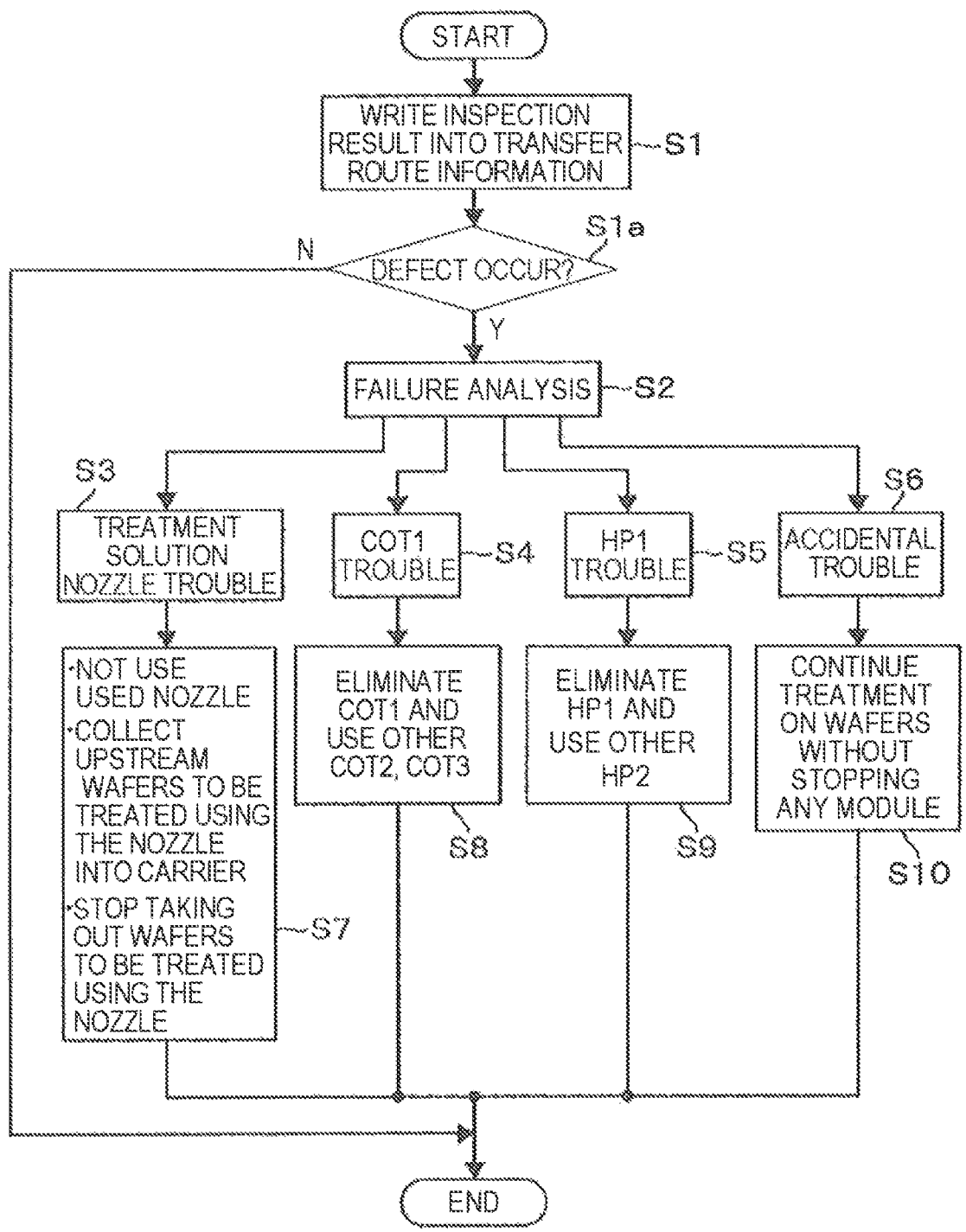
FIG. 9 is a flowchart explaining a method of changing an operation schedule in the embodiment.

In the case of other than the above-described three troubles, namely, when the wafers W which have been treated in the same module or using the same treatment solution nozzle 25 are not determined to be defective, for example, three times in a row, the trouble is determined to have accidentally occurred as illustrated in FIG. 8 (Step S6 in FIG. 9).

Figure 13:
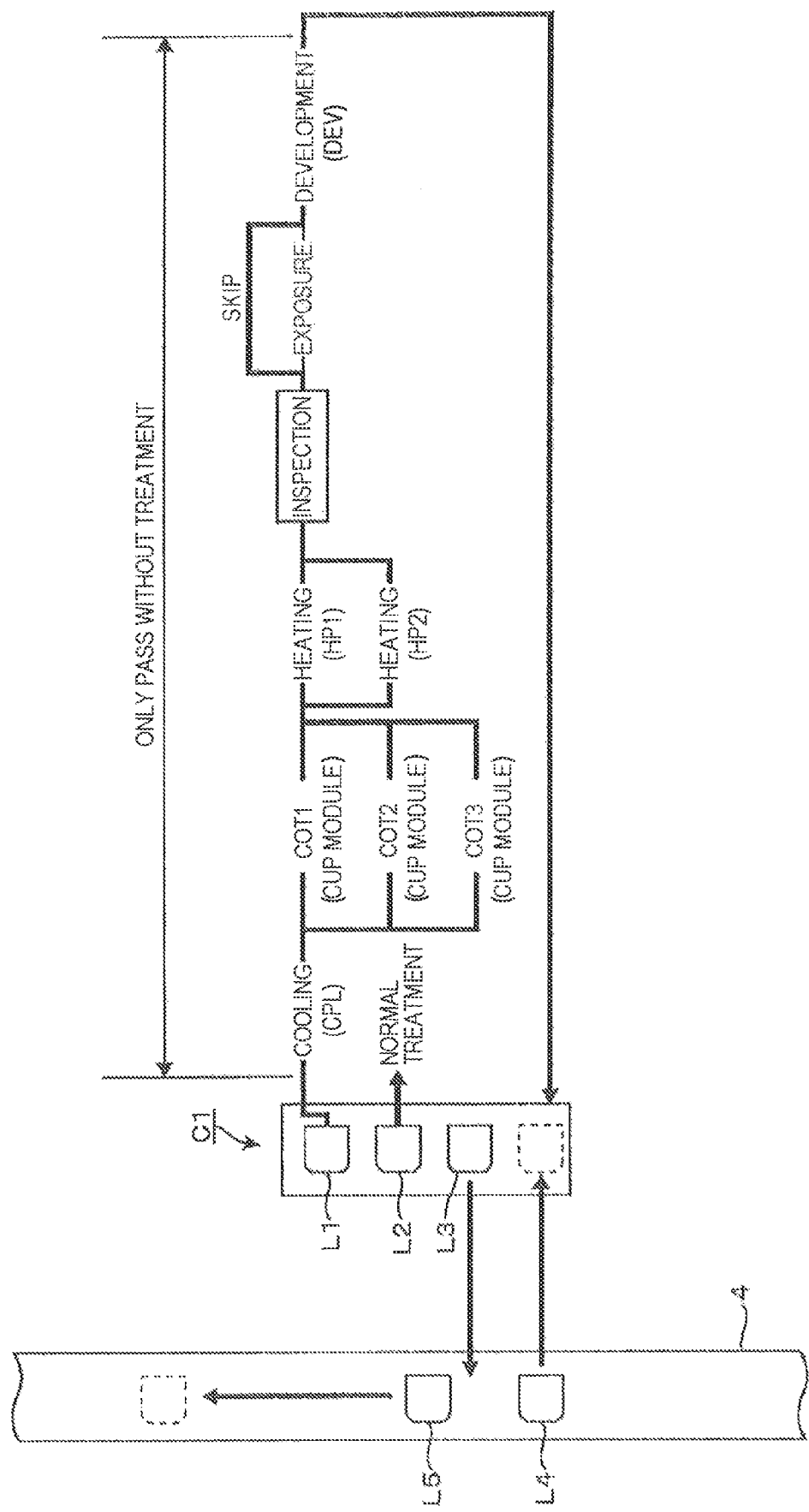
FIG. 13 is a schematic diagram explaining a transfer operation of substrates in the case of FIG. 10.
Figure 14:
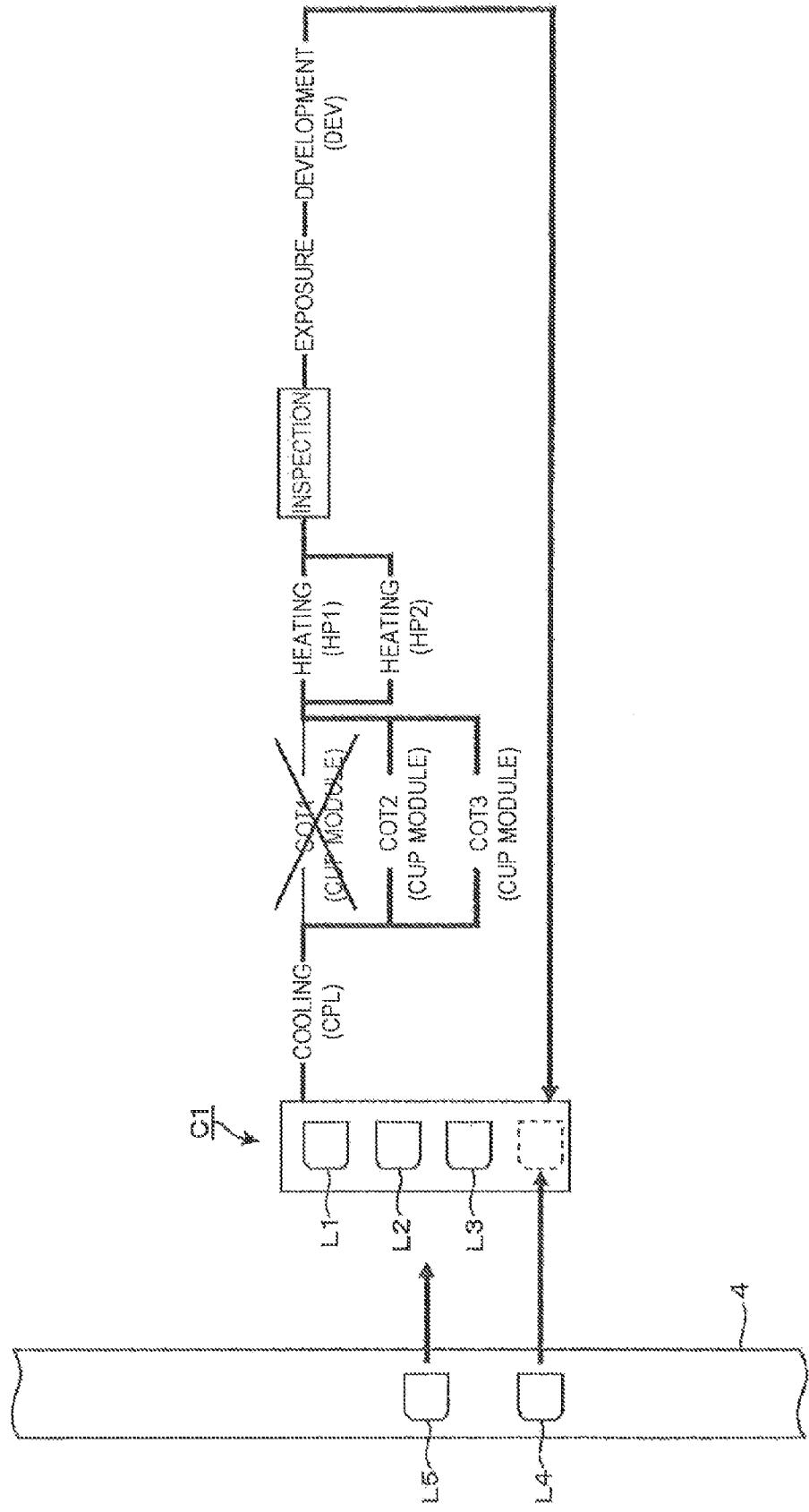
FIG. 14 is a schematic diagram explaining a transfer operation of substrates in the case of FIG. 11.
Figure 15:
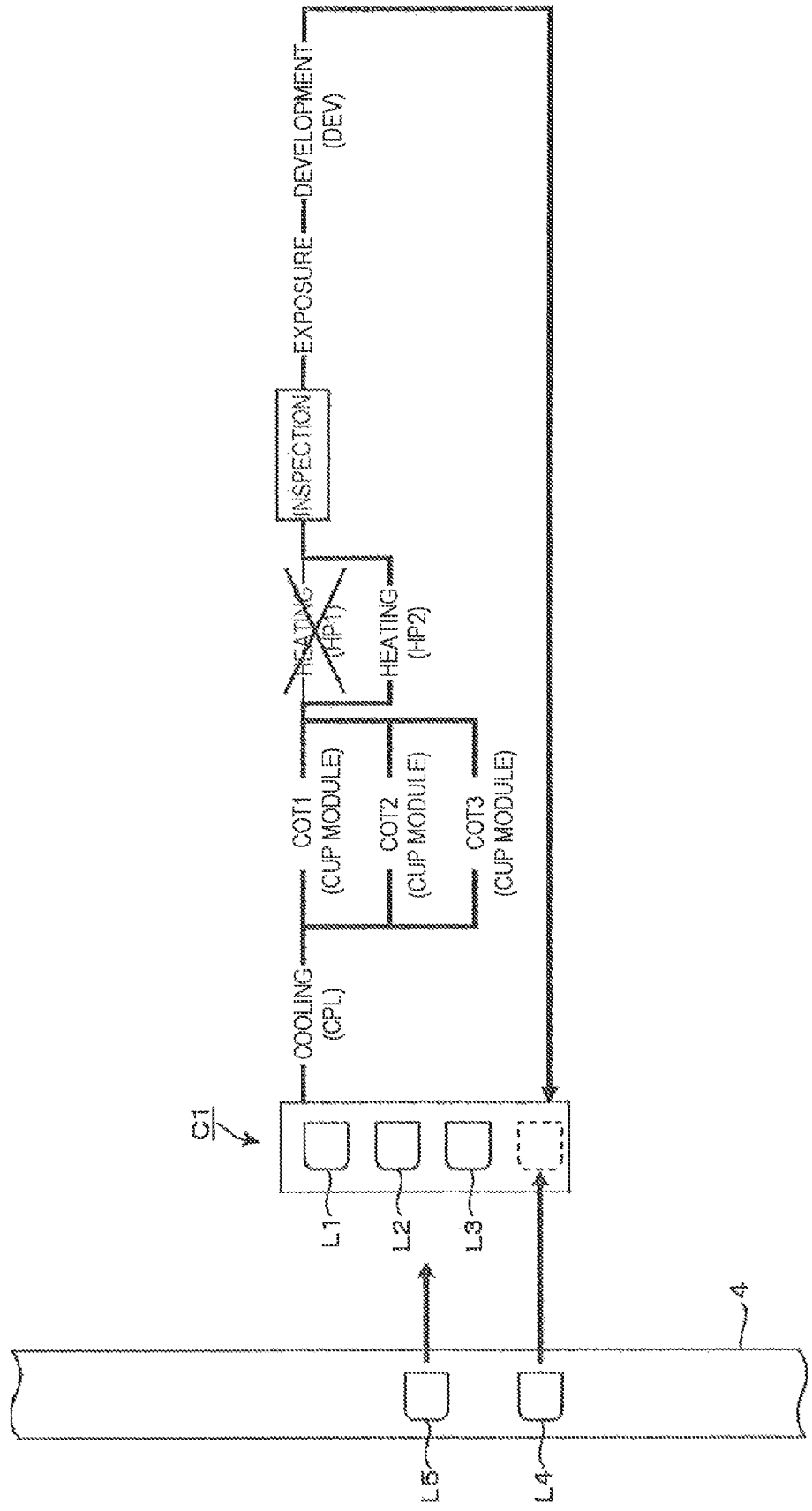
FIG. 15 is a schematic diagram explaining a transfer operation of substrates in the case of FIG. 12.

Subsequently, handling after the trouble portion is determined by the analysis program 54 will be described for each determined trouble. Note that L1 to L5 in FIG. 13 to FIG. 15 are carriers each housing a plurality of wafers W. The nozzles described here indicate the nozzles to be used in the resist coating units. In the carrier L1, wafers Wa in one lot which are to be treated using a treatment solution nozzle 25a (the treatment solution nozzle in which a trouble occurs in this example) are housed, and a part of the wafers Wa are being subjected to treatment in the coating and developing apparatus at present. In the carrier L2, wafers Wb in the next lot to be treated using a treatment solution nozzle 25b in which no trouble occurs are housed and are waiting in the carrier block C1 to be treated subsequent to the one lot. In the carrier L3, wafers W1 in the one lot to be treated using the treatment solution nozzle 25a are housed and waiting in the carrier block C1 to be treated subsequent to the wafers Wa in the carrier L1. The carrier L4 is being transferred by the ceiling transfer mechanism 4 toward the coating and developing apparatus and housing the wafers Wb in the next lot therein. The carrier L5 is being transferred by the ceiling transfer mechanism 4 toward the coating and developing apparatus and housing the wafers Wa in the one lot therein.

In the case of trouble of the treatment solution nozzle and the treatment solution supply system, the use of the treatment solution nozzle (treatment solution supply system) with trouble and the treatment on the wafers Wa in the one lot corresponding to that are stopped, and the treatment on the wafers Wb in the next lot is started as illustrated in FIG. 9 (Step S7 in the drawing) and FIG. 10. FIG. 13 schematically illustrates the wafers Wa, Wb and the transfer statuses of the carriers L1 to L5 in which the wafers Wa, Wb are housed. A part of the wafers Wa in the carrier L1 are being treated in the coating and developing apparatus, and the other untreated or treated wafers Wa are housed in the carrier L1. In this case, the transfer of the untreated wafers Wa to the coating and developing apparatus is stopped, and the treatment on the wafers Wa being treated is interrupted and returned to the carrier L1 through the scheduled transfer route. In this event, the transfer to the exposure block C4 of the wafers Wa whose treatment is interrupted before the exposure processing step is skipped. Further, the wafers Wa are only transferred into/out of the treatment modules along the transfer route but not treated therein. This carrier L1 is transferred by the ceiling transfer mechanism 4 to a not-illustrated retreatment apparatus, and the wafers Wa in the carrier L1 are subjected to retreatment (such as treatment of removing the film on the wafers Wa) therein.

The carrier L3, in which the wafers Wa to be treated using the treatment solution nozzle 25a (treatment solution supply system) with trouble are housed and which is waiting in the carrier block C1 for treatment at the time of occurrence of the trouble, is transferred by the ceiling transfer mechanism 4 to the outside of the coating and developing apparatus without treatment in the coating and developing apparatus. The carrier L5, which is being transferred for treatment by the ceiling transfer mechanism 4 to the coating and developing apparatus at the time of occurrence of the trouble, is transferred to the outside of the coating and developing apparatus without being transferred to the coating and developing apparatus.

As for the carriers L2, L4 in which the wafers Wb in the next lot to be treated using the treatment solution nozzle 25b without trouble are housed, the treatment is performed on the wafers Wb as scheduled in the coating and developing apparatus instead of the wafers Wa in the one lot.

Aspects of the wafers W and the carriers L housing the wafers W in the case of trouble of the coating module COT will be described referring to FIG. 9, FIG. 11, FIG. 14. First, the wafers Wa taken out of, for example, the carrier L1 and treated in the coating module COT1 are determined to be defective three times in a row, and the operation of the coating module COT1 is stopped. Even thereafter, the wafers Wa in the carrier L1 are subjected to treatment as scheduled using the modules COT2, COT3 other than the coating module COT1 as for the resist coating treatment. Subsequently, for the carriers L3, L5 in which the wafers Wa in the one lot are housed, the treatment as scheduled is similarly performed. Thereafter, also for the carriers L2, L4 in which the wafers Wb in the next lot are housed, the treatment is performed as scheduled except that the resist coating treatment is performed in the modules COT2, COT3 other than the coating module COT1 (Step S8 in FIG. 9).

Aspects of the wafers W and the carriers L housing the wafers W in the case of trouble of the heating module HP will be described referring to FIG. 9, FIG. 12, FIG. 15. First, the wafers Wa taken out of, for example, the carrier L1 and treated in the heating module HP1 are determined to be defective three times in a row, and the operation of the heating module HP1 is stopped. Even thereafter, the wafers Wa in the carrier L1 are subjected to treatment as scheduled using the heating module HP2 as for the heating treatment. Subsequently, for the carriers L3, L5 in which the wafers Wa in the same one lot are housed, the treatment as scheduled is similarly performed. Thereafter, also for the carriers L2, L4 in which the wafers Wb in the next lot are housed, the treatment is performed as scheduled except that the heating treatment is performed in the heating module HP2 (Step S9 in FIG. 9).

In the case of accidental trouble, only the wafers W determined to be defective are returned to the original carrier L passing through the scheduled transfer route also after the determination and then discarded, and the apparatus itself continues normal operation (Step S10 in FIG. 9).

Though the handling after a failure is detected in the inspection by the inspection module 3 is described in this example, even the case where it is determined that there is a failure in the treatment solution nozzle 25 by the above-described micro flowmeter and CCD camera 29 is handled as in the above-described case where a failure occurs in the treatment solution nozzle 25 (see Step S7 in FIG. 9).

According to this embodiment, in the technique of performing solution treatment on the wafers W using the plurality of treatment solution nozzles 25 corresponding to the plurality of treatment solutions used in the resist coating being the solution treatment, when a trouble occurs in the treatment solution nozzle 25 used in the solution treatment on the wafers W in one lot, the use of the treatment solution nozzle 25 (for example, 25a) corresponding to the one lot is stopped, and treatment for the next lot to be treated using the treatment solution nozzle 25 (for example, 25b) different from the treatment solution nozzle (25a) is started. Therefore, even if a coating defect due to a part of the treatment solution nozzles 25 occurs, the operation of the whole coating unit 2 is not stopped but the normally operating portion of the coating unit 2 is fully used, so that the decrease in the operating rate of the coating and developing apparatus can be suppressed.

Though the plurality of coating modules COT1 to COT3 are provided in the coating unit 2 in the above-described embodiment, the number of coating modules 20 provided in the coating unit 2 may be one in the present invention. In this case, the trouble of the discharge state of the resist solution in the treatment solution nozzle 25 can be specified, for example, through the monitoring using the CCD camera 29 illustrated in FIG. 5 and the abnormality in the detection value of the micro flowmeter provided in the resist solution supply system as described above. In such an example, the CCD camera 29 and the program for analyzing the data on the imaged image and the micro flowmeter corresponds to a monitoring section monitoring whether there is a failure in discharge of the treatment solution in the treatment solution nozzle 25. Alternatively, the abnormality in discharge of the resist solution may be monitored by providing a laser irradiation part irradiating the front surface of the wafer W with laser light and a camera imaging the front surface of the wafer W and analyzing waves of the resist solution generated on the front surface of the wafer W at discharge of the resist solution using the image data imaged by the camera. The operating method of the coating and developing apparatus after the detection of the abnormality in discharge of the resist solution from the treatment solution nozzle 25 is the same as that in the above embodiment. More specifically, the coating unit 2 is prohibited from being used for the wafers W to be treated using the treatment solution nozzle 25 determined to be abnormal, and the wafers W are prohibited from being transferred into the coating module to skip the coating unit for instance. The wafers W to be treated using the other treatment solution nozzles 25 are subjected to coating treatment of the resist solutions by the coating unit. Also in this example, the effects similar to those of the above embodiment are provided.

Figure 16:
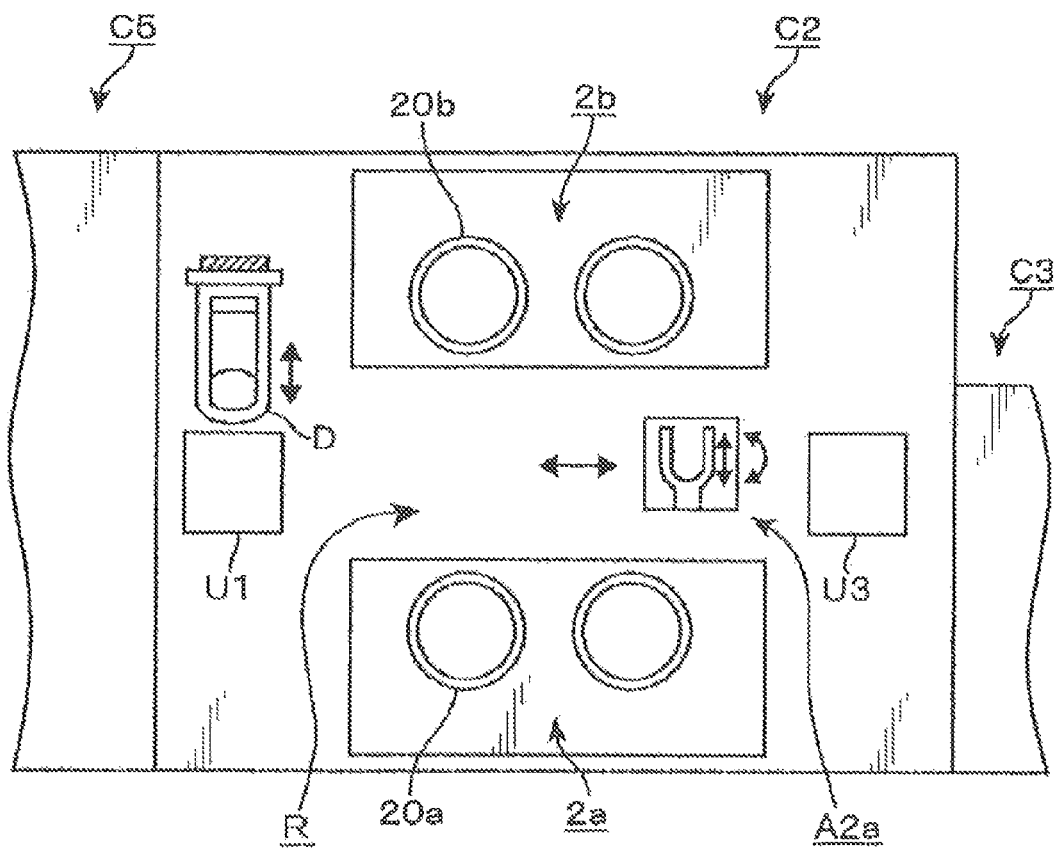
FIG. 16 is a plan view of a treatment block for explaining another example in the embodiment.

Though one coating unit 2 is provided in the third block (COT floor) B3 in the above embodiment, a plurality of coating units may be provided. FIG. 16 illustrates the COT floor B3 showing such an example in which a first coating unit 2a and a second coating unit 2b each of which is the same coating unit as that illustrated in FIG. 1 are provided on both sides of the transfer path R of the wafer W respectively. In this configuration example, the shelf units of the heating system can be arranged, for example, on the interface block side in the COT floor. At normal time, the coating treatment of the resist solution on the wafers W is shared by the two coating units 2a, 2b. However, for example, when it is determined that one treatment solution nozzle 25 is abnormal in the first coating unit 2a (more specifically, there is a trouble in the treatment solution nozzle 25 or in the supply system of the resist solution to the treatment solution nozzle 25), the wafers W in the lot to be treated using the treatment solution nozzle 25 are prohibited from being transferred into the coating unit 2a. Thereafter, for the wafers W in the lot to be treated using the treatment solution nozzle 25, the transfer schedule 51 is changed and treatment is performed using only the other coating unit 2b. Note that the wafers W in the lots to be treated using the treatment solution nozzles 25 other than the treatment solution nozzle 25 determined to be unusable, treatments are performed in parallel using the two coating units 2a, 2b.

Furthermore, when it is determined that there is abnormality in the treatment solution nozzle 25 in the coating unit 2 (the treatment solution nozzle 25 or the supply system of the resist solution) and an alarm is generated, the transfer schedule 51 is automatically changed by the computer, but the trigger causing the computer to change the transfer schedule 51 may be manual input. More specifically, an operator may input the instruction to prohibit the use of (exclude) the treatment solution nozzle 25 that is the object of the trouble based on recognition of the generation of the alarm, through an operation panel of the coating and developing apparatus to change the transfer schedule 51 so that the computer performs so-called "exclusion transfer" for the wafers W to be treated using the treatment solution nozzle 25 similarly as described in the above embodiment.

Though the description is made as for the time of occurrence of defect in the resist coating treatment in the above description, the solution treatment unit may be a solution treatment unit for forming an anti-reflection film when a plurality of kinds of treatment solutions are properly used depending on the substrates in the anti-reflection film forming treatment, for example, in the second block (BCT floor) B2. Furthermore, the present invention is also applicable in the case of using other treatment solutions other than the resist solution, such as a coating solution for forming an insulating film such as an SOD (Spin On Dielectric) film, an SOG (Spin On Glass) film, a polyimide film or the like, or a cleaning solution. Moreover, the object to be supplied with the treatment solution from the treatment solution nozzle is not limited to the wafer W, but the present invention is also applicable to other substrates such as an FPD (Flat Panel Display), a mask reticle for a photomask, and the like other than the wafer W.

What is claimed is:

1. A substrate treatment apparatus for performing, in a treatment block, solution treatment on a substrate taken out of a carrier, which is transferred into a carrier block, being a substrate transfer container, performing post-treatment in a treatment module subsequent to the solution treatment, and delivering the substrate which has been subjected to a series of treatments including the solution treatment and the post-treatment to the carrier, said apparatus comprising:
 a solution treatment section provided in said treatment block and including a solution treatment module configured such that a cup body surrounds a periphery of a substrate holding part horizontally holding the substrate, and a plurality of nozzles prepared for respective kinds of treatment solutions corresponding to lots of substrates;
 a transfer mechanism for transferring the substrate in said treatment block;
 a monitoring section monitoring whether there is a failure in discharge of the treatment solution in said nozzle; and
 a control unit outputting a control signal to prohibit the solution treatment in said solution treatment section for a substrate scheduled to be treated using a nozzle determined to have a failure by said monitoring section and to perform the solution treatment in said solution treatment section for a substrate scheduled to be treated using a nozzle other than the nozzle determined to have a failure.

2. The substrate treatment apparatus as set forth in claim 1, wherein a plurality of said solution treatment modules are arranged in said solution treatment section, and substrates are transferred in turns into said solution treatment section from an outside, and
 wherein said plurality of nozzles are shared between said plurality of solution treatment modules and moved between areas above said plurality of solution treatment modules.

3. The substrate treatment apparatus as set forth in claim 2, wherein said monitoring section has an inspection part performing inspection on the substrate which has been subjected to the solution treatment in said solution treatment unit, a storage part storing information on a transfer route of the substrate including each of said plurality of solution treatment modules, and a determination part determining that there is a failure in discharge of said nozzle used in the treatment on the substrate when the substrate treated in said solution treatment module is defective, for all of said plurality of solution treatment modules, using an inspection result of the substrate in said inspection part and the information on the transfer route of the substrate.

4. The substrate treatment apparatus as set forth in claim 1, wherein said control unit outputs a control signal to make a substrate, which has been already taken out of the carrier and is to be treated using the nozzle determined to have a failure, pass through said module where the post-treatment is performed after the solution treatment without being subjected to the post-treatment.

5. The substrate treatment apparatus as set forth in claim 1, wherein said control unit outputs a control signal to prohibit a substrate before being taken out of the carrier and scheduled to be treated using said nozzle determined to have a failure, from being taken out of the carrier.

6. The substrate treatment apparatus as set forth in claim 1, wherein a plurality of said solution treatment sections are provided, and
 wherein said control unit controls said transfer mechanism such that when a nozzle is determined to have a failure in one solution treatment section, the solution treatment is performed in another solution treatment section for a substrate scheduled to be treated using the nozzle determined to have a failure.

7. A substrate treatment method of performing, in a treatment block, solution treatment on a substrate taken out of a carrier, which is transferred into a carrier block, being a substrate transfer container, performing post-treatment in a treatment module subsequent to the solution treatment, and delivering the substrate which has been subjected to a series of treatments including the solution treatment and the post-treatment to the carrier, said method comprising the steps of:
 through use of a solution treatment section provided in the treatment block and including a solution treatment module configured such that a cup body surrounds a periphery of a substrate holding part horizontally holding the substrate, and a plurality of nozzles prepared for respective kinds of treatment solutions corresponding to lots of substrates,
 transferring the substrate by a transfer mechanism into the solution treatment module;
 discharging a treatment solution to the substrate from the nozzle discharging the treatment solution of the kind corresponding to the substrate to perform the solution treatment;
 monitoring whether there is a failure in discharge of the treatment solution in the nozzle; and
 controlling the transfer mechanism such that the solution treatment in the solution treatment section is prohibited for a substrate scheduled to be treated using a nozzle determined to have a failure by said monitoring step and the solution treatment in the solution treatment section is performed for a substrate scheduled to be treated using a nozzle other than the nozzle determined to have a failure.

8. The substrate treatment method as set forth in claim 7, wherein a plurality of the solution treatment modules are arranged in the solution treatment section, and substrates are transferred in turns into the solution treatment section from an outside, and
 wherein the plurality of nozzles are shared between the plurality of solution treatment modules and moved between areas above the plurality of solution treatment modules.

9. The substrate treatment method as set forth in claim 8, wherein said monitoring step has a step of performing inspection on the substrate which has been subjected to the solution treatment in the solution treatment unit, a step of storing information on a transfer route of the substrate including each of the plurality of solution treatment modules, and a step of determining that there is a failure in discharge of the nozzle used in the treatment on the substrate when the substrate treated in the solution treatment module is failure, for all of the plurality of solution treatment modules, using an inspection result of the substrate in the inspection part and the information on the transfer route of the substrate.

10. The substrate treatment method as set forth in claim 7, wherein a substrate which has been already taken out of the carrier and is scheduled to be treated using the nozzle determined to have a failure is made to pass through the module where the post-treatment is performed after the solution treatment without being subjected to the post-treatment.

11. The substrate treatment method as set forth in claim 7, wherein a substrate before being taken out of the carrier and scheduled to be treated using the nozzle determined to have a failure is prohibited from being taken out of the carrier.

12. The substrate treatment method as set forth in claim 7, wherein a plurality of the solution treatment sections are provided, and
wherein the transfer mechanism is controlled such that when a nozzle is determined to have a failure, in one solution treatment section, the solution treatment is performed in another solution treatment section for a substrate scheduled to be treated using the nozzle determined to have a failure.

13. A non-transitory storage medium storing a computer program used in a substrate treatment apparatus to cause the substrate treatment apparatus to execute a substrate treatment method,
wherein the substrate treatment method is a substrate treatment method of performing, in a treatment block, solution treatment on a substrate taken out of a carrier, which is transferred into a carrier block, being a substrate transfer container, performing post-treatment in a treatment module subsequent to the solution treatment, and delivering the substrate which has been subjected to a series of treatments including the solution treatment and the post-treatment to the carrier, the method comprising the steps of:

through use of a solution treatment section provided in the treatment block and including a solution treatment module configured such that a cup body surrounds a periphery of a substrate holding part horizontally holding the substrate, and a plurality of nozzles prepared for respective kinds of treatment solutions corresponding to lots of substrates, transferring the substrate by a transfer mechanism into the solution treatment module;

discharging a treatment solution to the substrate from the nozzle discharging the treatment solution of the kind corresponding to the substrate to perform the solution treatment;

monitoring whether there is a failure in discharge of the treatment solution in the nozzle; and controlling the transfer mechanism such that the solution treatment in the solution treatment section is prohibited for a substrate scheduled to be treated using a nozzle determined to have a failure by said monitoring step and the solution treatment in the solution treatment section is performed for a substrate scheduled to be treated using a nozzle other than the nozzle determined to have a failure.

* * * * *